United States Patent [19]

Gamand

[11] Patent Number: 5,017,887

[45] Date of Patent: May 21, 1991

[54] HIGH FREQUENCY IC POWER AMPLIFIER

[75] Inventor: Patrice Gamand, Yerres, France

[73] Assignee: U.S. Philips Corporation, New York, N.Y.

[21] Appl. No.: 447,965

[22] Filed: Dec. 7, 1989

[30] Foreign Application Priority Data

Dec. 9, 1988 [FR] France ................. 88 16231

[51] Int. Cl.⁵ ............................................. H03F 1/34
[52] U.S. Cl. ................................. 330/277; 330/290; 330/291; 330/293
[58] Field of Search ................... 330/87, 94, 277, 290, 330/291, 293

[56] References Cited

U.S. PATENT DOCUMENTS 4,591,802 5/1986 Asazawa ........................ 330/277

Primary Examiner—James B. Mullins
Attorney, Agent, or Firm—Bernard Franzblau

[57] ABSTRACT

An integrated semiconductor arrangement comprising a high-frequency power amplifier stage, which comprises two field-effect transistor having first connection means to influence the output power by means fo the unit gate width of the amplifier stage, and second connection means to influence the value of the input capacitance of the amplifier stage. This stage also comprises means to ensure the feedback of direct current to ground and also includes D.C. biasing means.

28 Claims, 5 Drawing Sheets

HIGH FREQUENCY IC POWER AMPLIFIER

BACKGROUND OF THE INVENTION

This invention relates to an integrated semiconductor arrangement comprising a high-frequency power amplifier stage.

An amplifier stage is known from the publication entitled: "GaAs IC Direct-Coupled Amplifiers" by D. HORNEBUCKLE in the "1980 IEEE/MTT Symposium Digest pp. 387–389". This document describes a three-transistor amplifier stage whose high-frequency input is connected to the gate of the first transistor arranged as an inverter, the drain of this first transistor being direct-coupled to the gate of a second transistor. The drain of this second transistor is direct-coupled to a D.C. supply voltage $V_{DD}$ and the source of this second transistor is coupled across diodes to the drain of a fourth transistor whose gate and short-circuited source are coupled to a negative D.C. supply voltage. This same drain is connected to the gate of a third transistor arranged as an inverter. The high-frequency output is realised at the drain of the latter transistor. This circuit has the disadvantage of being unstable at high frequency and also of generating oscillations. This is due to the fact that it is constituted by a transistor arranged in a common drain configuration followed by a transistor arranged in a common source configuration. This document also points out that the reflection coefficient at the input of the circuit having a 50 Ω load is more than 1. In effect, a negative resistance appears at the input of this circuit, which is not desirable for an amplifier.

A power amplifier stage is also known from the publication entitled "GaAs FET Principles and Technology" by James V. DILORENZO, pp. 230 to 347". This document specifically describes a power amplifier stage comprising a field-effect transistor of the interdigitated type formed by a plurality of gate fingers interleaved between drain and source fingers. Increasing the output power of such a component is realised by extending the number of gate fingers, drain and source fingers. By the size of the transistor is to be understood the width of the gate which is also proportional to the number of gate fingers.

SUMMARY OF THE INVENTION

One of the objects of the invention is to provide a high-frequency power amplifier stage whose output power is increased with respect to a prior-art power amplifier stage having the same extended gate with the same operating frequency.

A further object of the invention is to provide a power amplifier stage operating at higher frequencies than the stages known from the state of the art for the same output power and with the same extended gate.

The objects of the invention are achieved by means of a circuit as defined in the preamble and furthermore characterized in that this amplifier stage comprises two field-effect transistors having first connection means between them to influence the output power by means of the unit gate width of the amplifier stage, and second connection means between them to influence the value of the input capacitance of the amplifier stage, and in that this stage comprises means to ensure the feedback of direct current to ground and also includes D.C. biasing means.

BRIEF DESCRIPTION OF THE DRAWINGS

The invention will be better understood by means of the following description taken in conjunction with the appended drawing Figures in which.

DESCRIPTION OF THE PREFERRED EMBODIMENTS

Figure 1A:
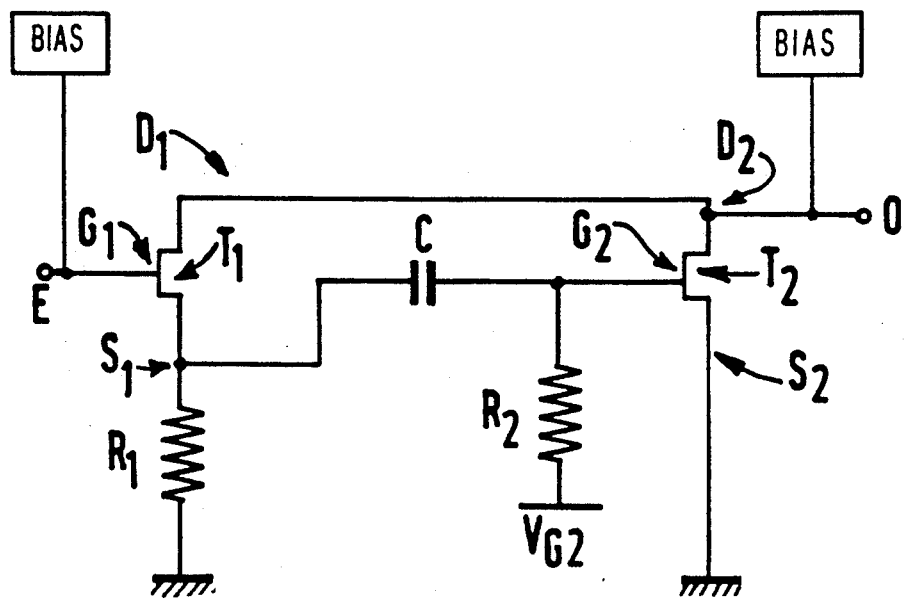
FIGS. 1a to 1d represent the circuit according to the invention in four alternative embodiments.

As has been represented in FIG. 1a, a circuit according to the invention comprises a first transistor $T_1$ whose gate $G_1$ receives the high-frequency input signal. This circuit also includes a second transistor $T_2$ whose drain $D_2$ produces the high-frequency output signal. According to the invention the drains $D_1$ and $D_2$ of the first and second transistors are direct-coupled, forming a means to influence the output power by means of the unit gate width of the amplifier stage formed by the two transistors.

The circuit according to the invention further includes means for influencing the value of the input capacitance of the stage in order to diminish this capacitance. These means consist of connecting the source $S_1$ of the first transistor to the gate $G_2$ of the second transistor.

Figure 1B:
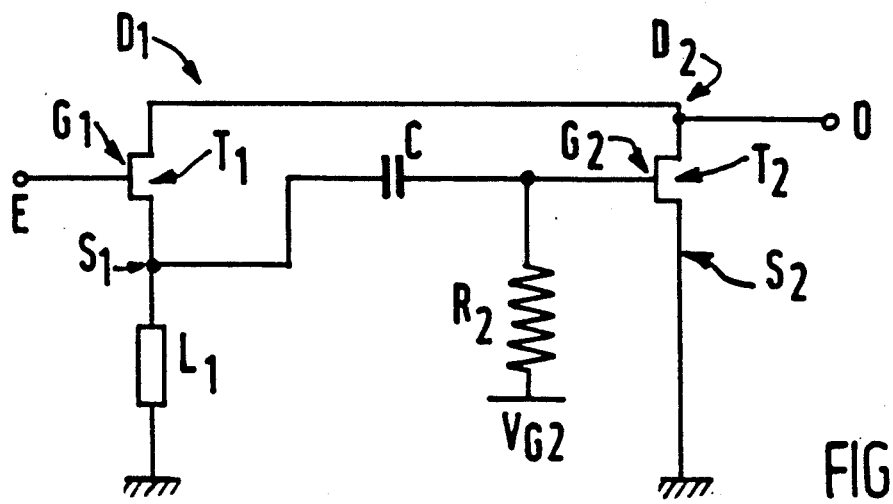

Means are furthermore provided to ensure the feedback of the direct current to ground. For this purpose, the source $S_1$ of the first transistor can be connected to ground through a resistor $R_1$ (cf. FIG. 1a), or instead over a high-frequency line $L_1$ as shown in FIG. 1b, or also by a transistor arranged in a resistor configuration $T'_1$ as shown in FIG. 1d.

In order to obtain this arrangement the short-circuited gate and source of the transistor $T'_1$ are connected to ground and its drain is connected to the source of the first transistor $T_1$.

The high-frequency line $L_1$ may advantageously have a value equal to a quarter of the frequency wavelength of the input signal.

The circuit according to the invention also includes biasing means comprising a resistor $R_2$ inserted between the gate electrode of the second transistor and a d.c. supply voltage $V_{G2}$. In this case the source $S_2$ of the second transistor is direct-coupled to ground.

Figure 1C:
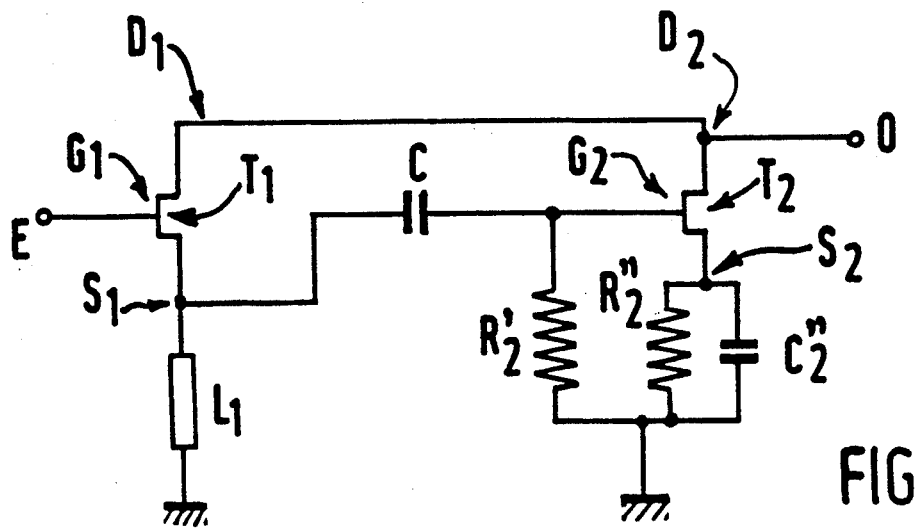
Figure 1D:
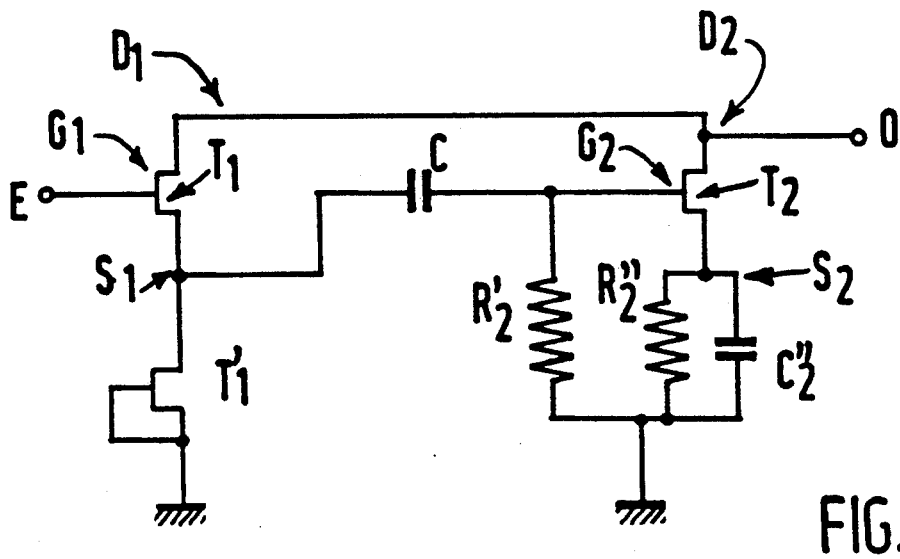

In an alternative embodiment of the invention shown in FIGS. 1c and 1d, the biasing means comprise a resistor $R'_2$ inserted between the gate $G_2$ of the second transistor and ground, and a resistor $R''_2$ connected in parallel with a decoupling capacitor $C''_2$ inserted between the source $S_2$ of the second transistor and ground. In this alternative embodiment the transistor $T_2$ is effectively self-biased.

Finally, the D.C. decoupling may be ensured by inserting a capacitor C between the source of the first transistor and the gate of the second transistor.

In either one of these two alternative embodiments of the invention the transmission line may be of the microstrip type or coplanar type deposited on a semi-conducting substrate, for example, the substrate accommodating the transistors $T_1$ and $T_2$ or on an aluminium substrate or on another substrate.

The circuit according to the invention can advantageously be realised with the elements whose values are set out in Table I.

In addition, the circuit according to the invention is preferably realised on a gallium arsenide substrate by means of field-effect transistors.

The transistor $T_1$ of the circuit according to the invention has a gate width $W_1$ and the transistor $T_2$ a gate width $W_2$. Hereinafter the performance of the circuit according to the invention will be compared to the performance of a power amplifier stage as described in the second said state-of-the-art document and whose gate width is $W = W_1 + W_2$.

A calculation of the input impedance of the circuit according to the invention shows that the real part of this impedance is always greater than 0.

Figure 3:
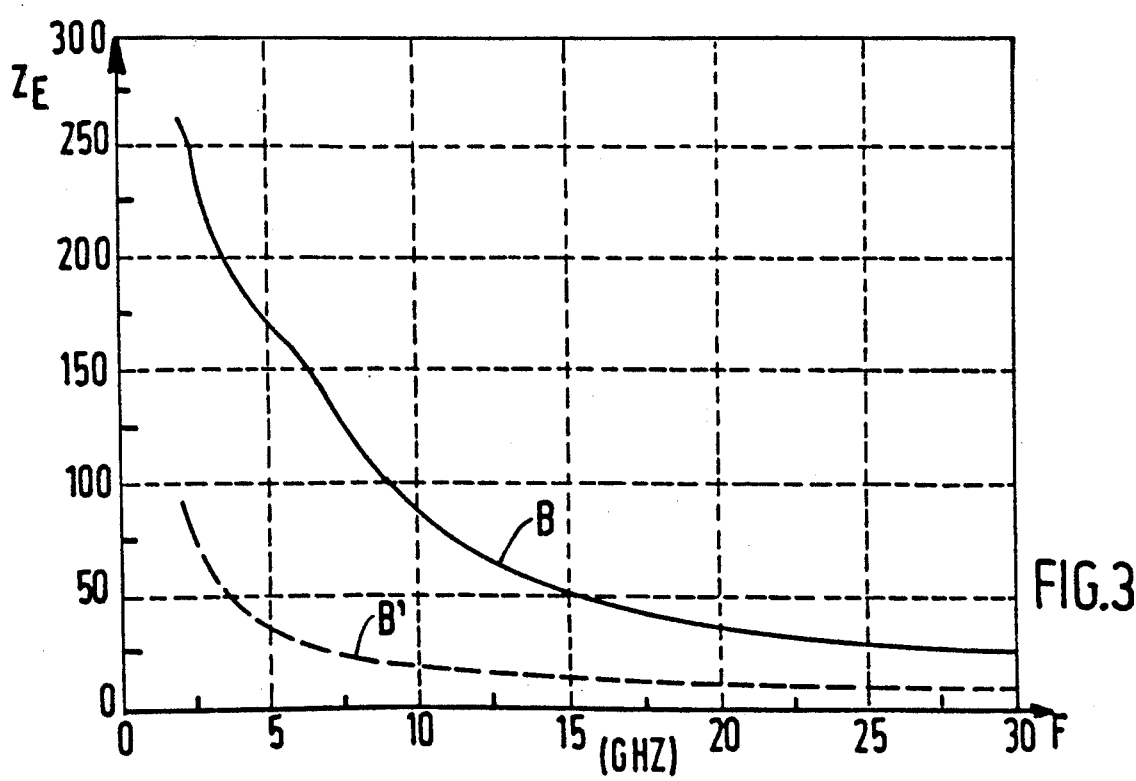
FIG. 3 shows the real part of the input impedance signal $Z_E$ of the same elements.

FIG. 3 shows in a solid line (curve B) the module of this input impedance $Z_E$ plotted against the frequency F versus the module of the input impedance of a circuit formed by a single power transistor having the same extended gate (curve B').

FIG. 3 shows that with the same extended gate the input impedance of the circuit according to the invention is larger than that of a single transistor, as is used in the second said document.

It is a known fact that the input impedance of a transistor is inversely proportional to its gate width. It is also a known fact that if one desires to increase the output power of the stage comprising this transistor, it is the gate width of this transistor that is to be increased. Thus, if one desires to increase the output power of a state-of-the-art amplifier stage mentioned in the second said document, one automatically reduces its input impedance, which is extremely inconvenient because the adaptation to the input then becomes difficult.

According to the invention the output power can be increased by increasing the gate width of the two transistors because the reduced input impedance which would result therefrom with a prior-art arrangement is compensated for with this invention.

Alternatively, it is also known that increasing the gate width of a transistor causes the stray capacitance at the input to increase. According to the invention this inconvenience is avoided. In effect, the disturbing capacitance is in the first place given by:

$(C_1+C_2)/2$, where
$C_1$ is the input capacitance of the transistor $T_1$ and
$C_2$ is the input capacitance of the transistor $T_2$.
The disturbing capacitance is thus smaller than that of the known arrangement having the same extended gate.

According to the invention it is thus possible:
either to increase the power of the amplifier stage by increasing the size of the transistor while avoiding the disadvantages of the known circuit, with an equal cut-off frequency, whereas the cut-off frequency is bounded by the input capacitance;
or to increase the cut-off frequency while maintaining the same output power.

Figure 2:
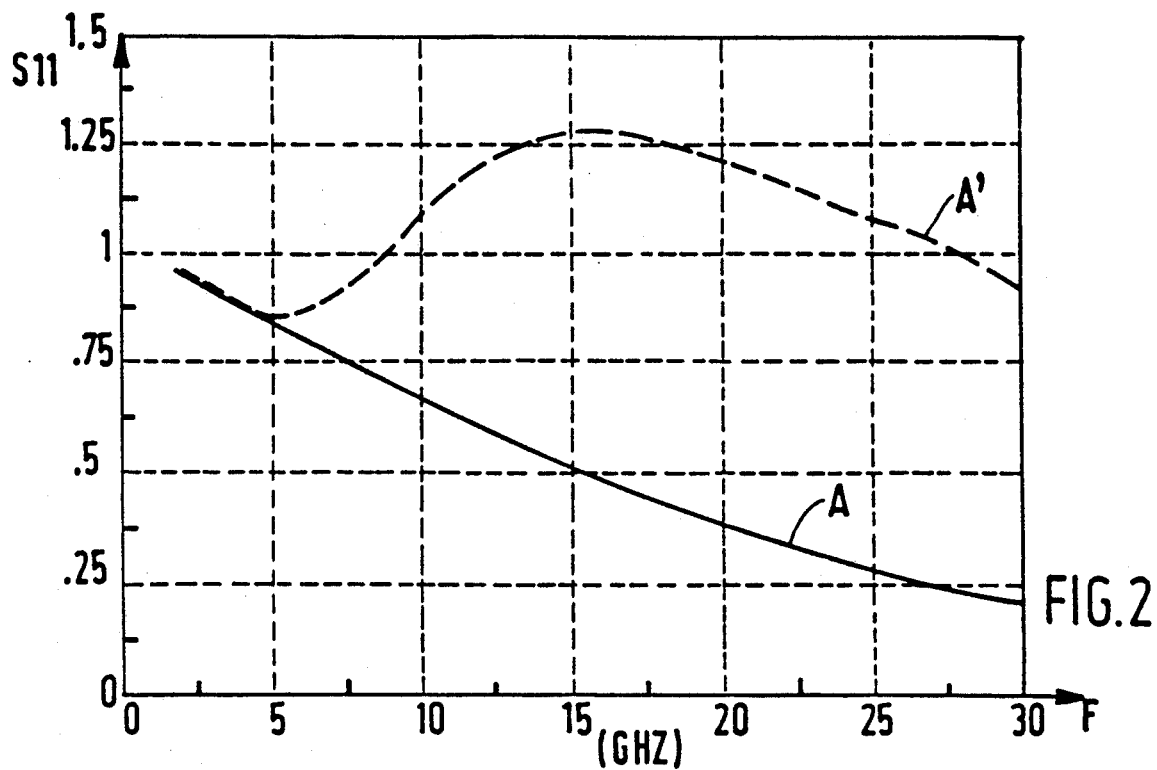
FIG. 2 shows the coefficient $S_{11}$ of the circuit according to the invention in a solid line and, in a broken line, that of a power transistor having the same extended gate, each plotted against frequency.

FIG. 2 shows in a solid line (curve A) the reflection coefficient $S_{11}$ at the input of the circuit and in a broken line (curve A') the reflection coefficient of an amplifier stage formed by a single transistor having the same extended gate. It will be noted that the stage according to the invention has a reflection coefficient $S_{11}$ at the input which is always less than 1, which is more advantageous for realising an amplifier.

Figure 4:
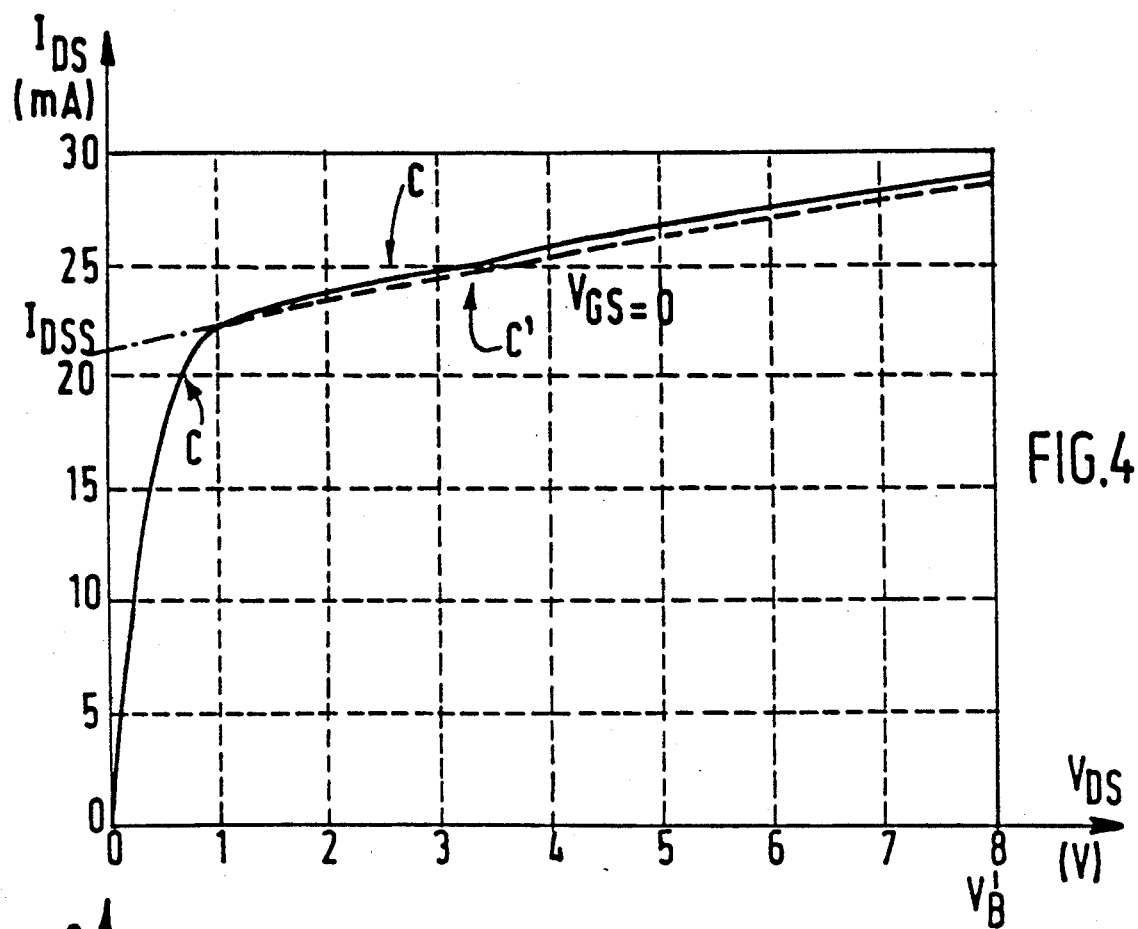
FIG. 4 shows the drain-source current plotted against the drain-source voltage of the same elements.

FIG. 4 shows in a broken line (curve C') the characteristics of the total output current $I_{DS}$ plotted against the output voltage $V_{DS}$ for the prior-art stage and in a solid line (curve C) for the circuit according to the invention with a gate-source input bias $V_{GS}=0$ volts.

The maximum output power can be calculated on the basis of these curves and has the following value for the circuit according to the invention:

$$P_{max} = 1/8 \cdot V_b \times I_{DSS},$$

where $V_b$ is the avalanche voltage and $I_{DSS}$ the drain-source saturation current.

The output powers of the circuit according to the invention and the prior-art circuit are thus identical. But, as the input impedance is higher than in the prior-art circuit, this output power can thus be obtained at a much higher frequency.

Moreover, the gate bias of the second transistor of the circuit according to the invention acts as an adjustment controller and makes it possible to adjust this output power.

Figure 5:
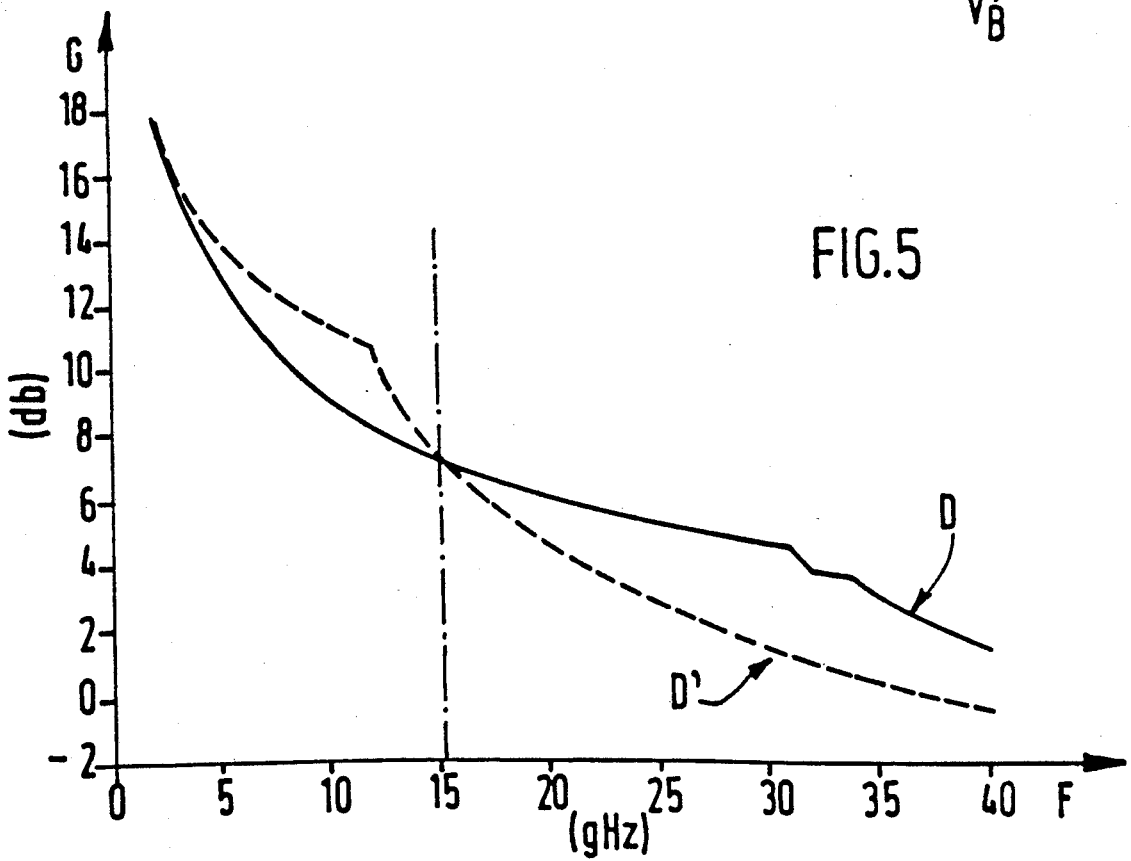
FIG. 5 shows the gain G plotted against the frequency F of the same elements.

FIG. 5 shows the maximum gain G in a solid line (curve D) for the circuit according to the invention and in a broken line (curve D') the gain for the prior-art one-transistor amplifier stage, each plotted against the frequency F. These curves show that the gain is approximately 2 dB higher for the circuit according to the invention and that this is realised over a very wide frequency band.

The circuit according to the invention thus presents the following advantages:
it is more stable;
it shows a higher input impedance;
it has a higher gain at high frequency; the gain can be controlled by the choice of the gate bias of the second transistor;
the size of the transistors can be chosen to give priority to one of the above advantages.

Finally, the arrangement according to the invention can be inserted between two adapting circuits, one adapting circuit for the input and one adapting circuit for the output, so as to form a conventional amplifier circuit. The adapting circuit for the input is to comprise means to bias the gate of the first transistor and the adapting circuit for the output is to comprise means to bias the drains of the two transistors simultaneously.

TABLE I

| | Transistors | Resistors | Capacitors |
|---|---|---|---|
| $T_1$ { | $l_1 = 0.5$ μm<br>$W_1 = 100$ μm<br>$l_2 = 100$ μm | $R_1 = 1$ kΩ<br>$R_2 = 1$ kΩ<br>$R'_2 = 1$ kΩ | C = 5 pF |
| $T_2$ { | $W_2 = 100$ μm | $R''_2 = 10$ to 30 Ω | |

In this Table $l_1$ and $l_2$ are the gate lengths of the transistors $T_1$ and $T_2$ respectively, and $W_1$ and $W_2$ are their gate widths.

With the same gatewidth of the transistor, the amplifier according to the arrangement of the preceding embodiment thus always has a gain which is much higher than that of an arrangement in which a single transistor is used.

A further embodiment will now be described of an amplifier with which it is possible to attain an even higher gain and perfect stability and which is based on an amplifier according to the preceding embodiment.

Figure 6:
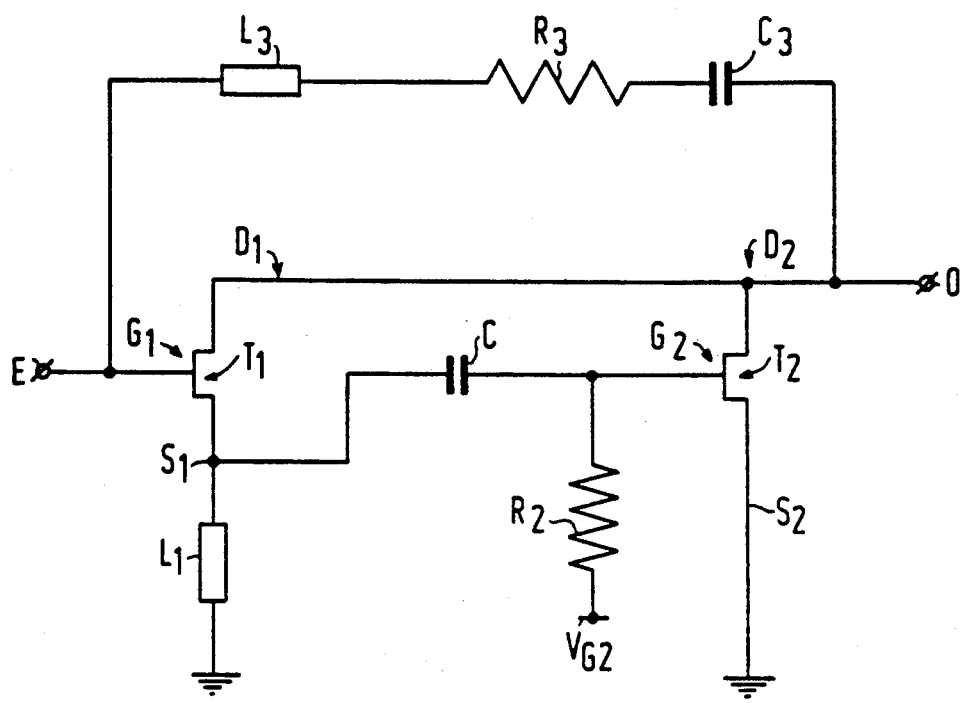
FIG. 6 shows a high-gain amplifier including a circuit as shown in FIG. 1b.

As represented in FIG. 6, the high-gain amplifier circuit is constituted by the circuit of FIG. 1b which further includes a negative feedback circuit coupled between its output O, i.e. the drain of transistor $T_2$, and its input E, or gate of transistor $T_1$. The high-gain amplifier might also be a variant of the circuits shown in FIGS. 1a, 1c or 1d.

Whatever the frequency band used, the circuit as shown in FIG. 6 is stable when the feedback is negative, for example, a feedback circuit formed by a self-inductance $L_3$ connected in series with a resistor $R_3$ and a capacitance $C_3$.

In this embodiment the elements may have the values indicated in Table I if they are in conformity with those of FIGS. 1a to 1d with the exception of the size of the transistors, and with the values indicated in Table II if they form the negative feedback.

TABLE II $R_3 = 125\ \Omega$
$L_3 = 3 \times 2615\ \mu m$
$C_3 = 7\ pF$ $T_1 \begin{cases} l_1 = 0.5\ \mu m \\ W_1 = 500\ \mu m \end{cases}$ $T_2 \begin{cases} l_2 = 0.5\ \mu m \\ W_2 = 500\ \mu m \end{cases}$ In the embodiment realised by means of the elements stated in Table II, the self-inductance is a high-frequency line.

Figure 7:
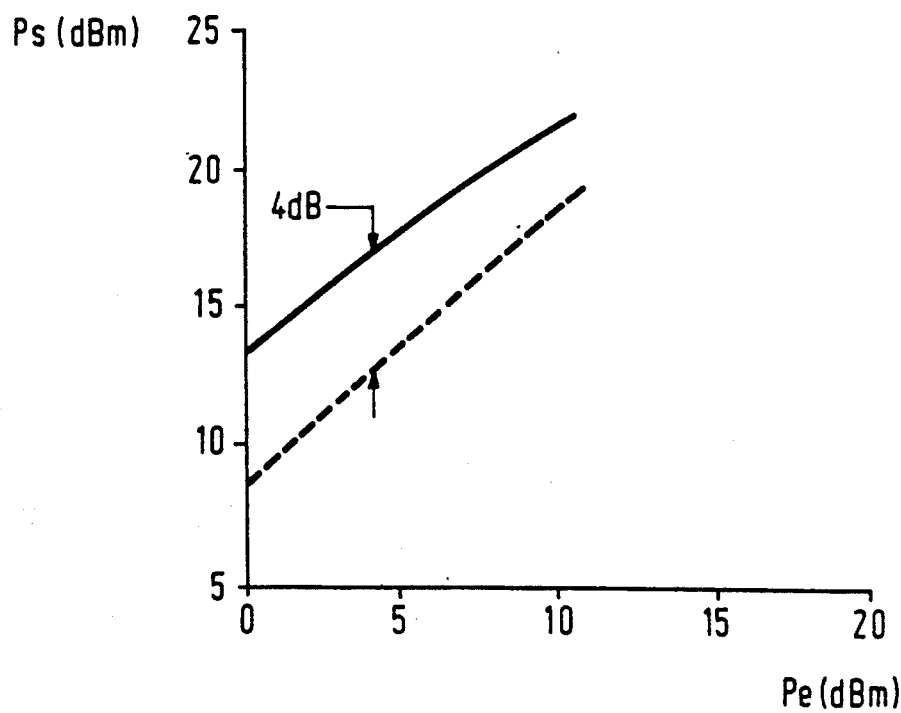
FIG. 7 shows the output power plotted against the input power of the circuit shown in FIG. 6.

FIG. 7 shows the output power $P_S$ in dBm plotted against the input power $P_e$ in dBm of the circuit shown in FIG. 6. The output power in the range from 0 to 10 dBm of the input signal is higher by an order of 4dB than that of a circuit comprising a single transistor of the same dimension. In this input signal range the power gain is thus double the gain to be attained with the circuits of FIGS. 1a to 1d and the stability is even improved.

One should preferably use the circuit of the first embodiment for so-called power amplifiers and the circuit of the second embodiment to realise so-called high-gain amplifiers.

In addition, by means of the circuit described in the second embodiment, an oscillator may be realised by selecting the elements of the negative feedback loop to form a positive feedback circuit. Such a variant, with the elements already described for realising the first embodiment, is within the ability of those skilled in the art and for this reason has not been discussed above.

I claim:

1. An integrated semiconductor arrangement comprising a high-frequency power amplifier stage which comprises: first and second field-effect transistors having first connection means to influence the output power by influencing the unit gate width of the amplifier stage, second connection means to influence the value of the input capacitance of the amplifier stage, means to ensure the feedback of direct current to ground, and D.C. biasing means.

2. An arrangement as claimed in claim 1, wherein said first connection means include a connection between coupled drains of the first and second transistors, a high-frequency output signal being available at the coupled common drains.

3. An arrangement as claimed in claim 2, wherein said second connection means include means for connecting a source of the first transistor, which first transistor receives a high-frequency input signal, to a gate of the second transistor.

4. An arrangement as claimed in claim 3, wherein the means to ensure the feedback of direct current to ground comprises a high-frequency line coupled between the source of said first transistor and ground.

5. An arrangement as claimed in claim 4, wherein the high-frequency line has a value equal to a quarter wavelength of the frequency wave of the input signal.

6. An arrangement as claimed in claim 4, wherein the biasing means comprise a high resistance coupled between gate electrode of said second transistor and a D.C. supply terminal and a direct connection means coupled between the source of the second transistor and ground.

7. An arrangement as claimed in claim 4, wherein the biasing means include a resistor connected between the gate electrode of said second transistor and ground, and also a resistor and a decoupling capacitor connected in parallel between a source of said second transistor and ground.

8. An arrangement as claimed in claim 3, wherein the means to ensure the feedback of direct current to ground comprises a high resistance resistor connected between the source of said first transistor and ground.

9. An arrangement as claimed in claim 8, wherein the resistor comprises a third transistor having a short-circuited gate and source which are connected to ground, a drain of said third being connected to the source of said first transistor.

10. An arrangement as claimed in claim 9, wherein the biasing means comprise a high resistance coupled between the gate electrode of said second transistor and a D.C. supply terminal and a direct connection means coupled between the source of the second transistor and ground.

11. An arrangement as claimed in claim 9, wherein the biasing means include a resistor connected between the gate electrode of said second transistor and ground, and also a resistor and a decoupling capacitor connected in parallel between a source of said second transistor and ground.

12. An arrangement as claimed in claim 11 wherein said means for connecting the source of said first transistor to the gate of said second transistor comprise a DC decoupling capacitor.

13. An arrangement as claimed in claim 8, wherein the biasing means comprise a high resistance coupled between the gate electrode of said second transistor and a D.C. supply terminal and a direct connection means coupled between the source of the second transistor and ground.

14. An arrangement as claimed in claim 8, wherein the biasing means include a resistor connected between the gate electrode of said second transistor and ground, and also a resistor and a decoupling capacitor connected in parallel between a source of said second transistor and ground.

15. An arrangement as claimed in claim 3 which further includes a negative feedback loop coupled between a high frequency output and a high frequency input of said arrangement.

16. An arrangement as claimed in claim 3 wherein said means for connecting the source of said first transistor to the gate of said second transistor comprise a DC decoupling capacitor.

17. An arrangement as claimed in claim 3, wherein an input of the amplifier stage is connected to a first bias circuit comprising means for biasing a gate of the first transistor, and means connecting an output of the amplifier stage to a second bias circuit comprising means for biasing the drains of the first and second transistors simultaneously.

18. An arrangement as claimed in claim 2, wherein an input of the amplifier stage is connected to a first bias circuit comprising means for biasing a gate of the first transistor, and means connecting an output of the amplifier stage to a second bias circuit comprising means for biasing the drains of the first and second transistors simultaneously.

19. An arrangement as claimed in claim 2 which further includes a positive feedback loop coupled between a high frequency output and a high frequency input of said arrangement.

20. An arrangement as claimed in claim 19, wherein the positive feedback loop comprises a series connection of an inductance, a resistor and a capacitance.

21. An arrangement as claimed in claim 20, wherein the inductance comprises a high-frequency line.

22. An arrangement as claimed in claim 1 which further includes a negative feedback loop coupled between a high frequency output and a high frequency input of said arrangement.

23. A high-frequency IC amplifier stage comprising:
first and second field effect transistors coupled together by a first connection means so as to control the amplifier stage output power by influencing the unit gate width of the amplifier stage,
an input terminal for supplying a high-frequency input signal to a control electrode of the first field effect transistor,
an output terminal coupled to a first main electrode of the second field effect transistor,
second connection means coupling one main electrode of the first field effect transistor to a control electrode of the second field effect transistor thereby to determine the input capacitance of the amplifier stage,
means providing a feedback of direct current to ground, and
means for DC biasing at least one of said first and second field effect transistors.

24. An amplifier stage as claimed in claim 23, wherein said first connection means comprise a direct connection between the first main electrode of the second field effect transistor and a corresponding first main electrode of the first field effect transistor.

25. An amplifier stage as claimed in claim 24, wherein said feedback providing means comprise a diode-connected field effect transistor connected between said one main electrode of the first field effect transistor and ground.

26. An amplifier stage as claimed in claim 24, wherein said DC biasing means are coupled to the control electrode of the second field effect transistor, the feedback providing means are coupled to said one main electrode of the first field effect transistor, and said second connection means comprise a capacitor.

27. An amplifier stage as claimed in claim 24, further comprising a feedback circuit coupled between said output terminal and said input terminal of the amplifier stage.

28. An amplifier stage as claimed in claim 27, wherein said feedback circuit comprises a series circuit including an inductance, a resistance and a capacitance.

* * * * *